(12) United States Patent
Wang

(10) Patent No.: US 6,310,779 B1
(45) Date of Patent: Oct. 30, 2001

(54) SYSTEM FOR ATTACHING CARTRIDGE-TYPE CPU TO A BOARD

(75) Inventor: Li-Chung Wang, Taipei (TW)

(73) Assignee: Asustek Computer Inc. (TW)

( * ) Notice: Subject to any disclaimer, the term of this patent is extended or adjusted under 35 U.S.C. 154(b) by 0 days.

(21) Appl. No.: 09/459,256

(22) Filed: Dec. 10, 1999

(30) Foreign Application Priority Data

Mar. 8, 1999 (TW) .................................................. 88103533

(51) Int. Cl.[7] .......................... H05K 7/02; H01R 13/627; H01R 13/62
(52) U.S. Cl. ............................ 361/760; 439/360; 439/327
(58) Field of Search ..................................... 361/760, 759, 361/756, 747, 740, 683, 684, 685, 686, 801, 802, 803; 439/377, 378, 327, 328, 360

(56) References Cited

U.S. PATENT DOCUMENTS

| | | | |
|---|---|---|---|
| 3,790,051 | * 2/1974 | Moore | 225/1 |
| 3,829,741 | * 8/1974 | Athey | 317/101 DH |
| 5,737,189 | * 4/1998 | Kammersgard et al. | 361/726 |
| 5,810,613 | * 9/1998 | Ati et al. | 439/157 |
| 6,007,357 | * 12/1999 | Perino et al. | 439/327 |

* cited by examiner

Primary Examiner—Brian Sircus
Assistant Examiner—Chaudrika Prasad
(74) Attorney, Agent, or Firm—Coudert Brothers

(57) ABSTRACT

The system provided attaches a cartridge-type central processor unit (CPU) to a motherboard and includes a first device, a second device and a third device. The first device has a slot for receiving the cartridge-type CPU. The second device is disposed below the motherboard to fortify the strength of the motherboard. The third device functions to attach the first device and the motherboard to the second device. The weight of the cartridge-type CPU, via the first device and the third device, is substantially transferred to the second device with the second device being a primary carrier of weight of the cartridge-type CPU. Since weight of the cartridge-type CPU is not carried by the motherboard, motherboard will experience no damage.

20 Claims, 11 Drawing Sheets

_US 6,310,779 B1_

SYSTEM FOR ATTACHING CARTRIDGE-TYPE CPU TO A BOARD

FIELD OF INVENTION

The present invention relates to a system attaching cartridge-type CPU to a motherboard of a computer system.

BACKGROUND OF THE INVENTION

CPU is the core component of a computer. Due to improvement of semiconductor production processes, the function and process speed of CPU progresses tremendously. On the other hand, with more functions built within the CPU, increase with respect to the weight and size of CPU has been observed. Using products of Intel® as an example, from the early 486 CPU to Pentium CPU, the products shipped out were packaged in single chip form. Depending on the choice of socket 5 or socket 7 architecture, the CPU is attached to the motherboard through a socket. Hence, under this arrangement, regardless of whether the motherboard is disposed vertically or horizontally in the computer casing, the weight of the CPU usually puts no loading on the motherboard.

Intel® unveiled, in close succession, new types of CPU, such as Pentium II. It is known, instead of the conventional chip BGA packaging approach, Pentium II architecture uses a print circuit board (PCB) to integrate the CPU and the required cache memory. At the same time, side edge contact cartridge (SECC) type packaging is employed to render a cartridge-type Pentium II (CPU). The cartridge-type CPU then copes with SLOT-1 architecture on the motherboard to constitute the computer system. It is observed that the cartridge-type CPU results in the increase of the weight and size of the CPU module. Therefore, one conventional approach, as shown in FIG. 1, employs an insertion frame 12 which is affixed to the motherboard 11. The insertion frame 12 provides a slot for receiving the cartridge-type CPU 13. As the motherboard 11 is disposed horizontally within the computer casing, this arrangement will not create too much loading to the motherboard 11.

Yet to consider the problem of heat dissipation inside the computer casing, most computer casings nowadays are designed to be disposed vertically. As such, the motherboard inside is placed vertically within the casing and the forced air convection approach is applied to improve the cooling ability. However, while the motherboard is disposed vertically, the motherboard must be capable of carrying weight of the cartridge-type CPU which is disposed vertically to the motherboard. If it is not well designed, the motherboard may experience damage due to the weight of the cartridge-type CPU Intel® company recently puts a more powerful cartridge-type CPU, i.e. Xeon, into the market. In addition to using a super-sized SECC, it is larger in size and weight compared with Pentium 11. Furthermore, based on the functions of Xeon, a multi-processor computer system may include two or four Xeon CPUs on a motherboard to enhance the parallel processing capability of the computer system. It is quite clear that, when several super-sized cartridge-type CPUs are simultaneously attached to a motherboard, there must be a suitable CPU attachment system to take care of the loading over the motherboard exerted by the cartridge-type CPUs.

As illustrated in FIG. 2, one conventional approach employs at least one vertically-disposed fixation stripe 22 which is attached to the computer casing 21.

The fixation stripe 22 presses against the edge of cartridge-type CPU 23 tightly so that part of the weight of cartridge-type CPU 23 is transferred to casing 21 via the fixation stripe 22. Under this approach, the casing 21 requires a corresponding structure to connect the fixation stripe 22. And this corresponding structure on the casing 21 varies as size or shape of the fixation stripe 22 changes.

SUMMARY OF INVENTION

In light of the above concerns, main objective of the invention is to bring about a system and method for attaching the cartridge-type CPU so that the cartridge-type CPU is precisely attached onto the motherboard without taking too much weight of the cartridge-type CPU.

The system provided attaches a cartridge-type central processor unit (CPU) to a motherboard and includes a first device, a second device and a third device.

The first device has a slot for receiving the cartridge-type CPU. The second device is disposed below the motherboard to fortify the strength of the motherboard. The third device functions to attach the first device and the motherboard to the second device. The weight of the cartridge-type CPU, via the first device and the third device, is substantially transferred to the second device with the second device being a primary carrier of weight of the cartridge-type CPU.

The attachment system doesn't interact with the computer casing, thus avoiding the compatibility issue between different motherboards and different computer casings.

BRIEF DESCRIPTION OF THE DRAWINGS

To have a better understanding of the structure and characteristics of the invention, the following recitations regarding preferred embodiments of the invention are made with reference to the accompanied drawings.:

FIG. 4(*b*) illustrates how to remove the cartridge-type CPU using uprooting device.

FIG. 6(*b*) illustrates the invention in assembly form.

FIG. 7(*b*) illustrates the assembly relationship of the fourth device with respect to other elements of the invention.

FIG. 10(*b*) illustrates the invention with the fourth device in FIG. 7(*a*) as the motherboard is placed vertically.

DETAILED DESCRIPTION OF THE EMBODIMENTS

Figure 1:
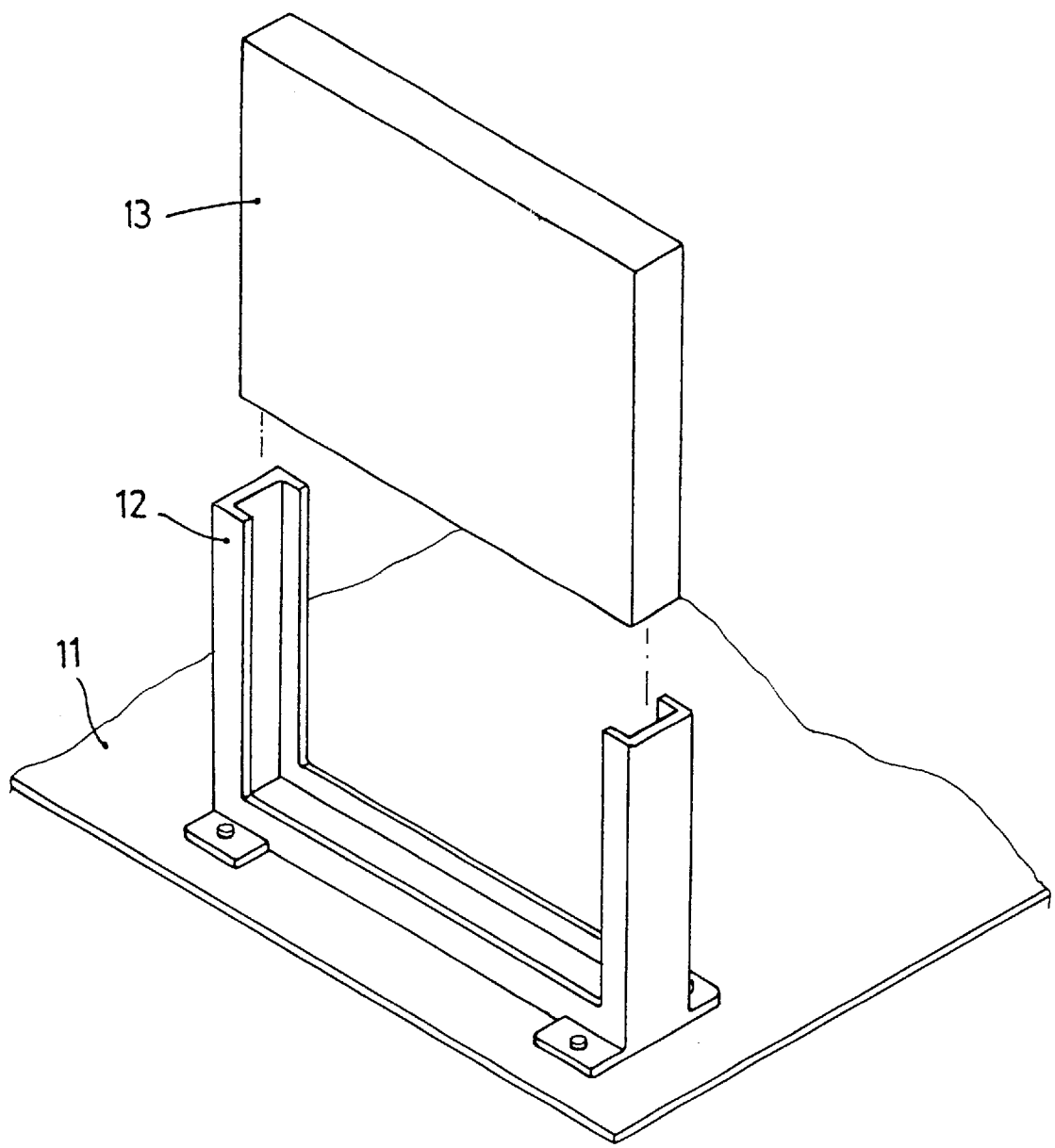
FIG. 1 illustrates one conventional approach to affix the cartridge-type CPU.
Figure 2:
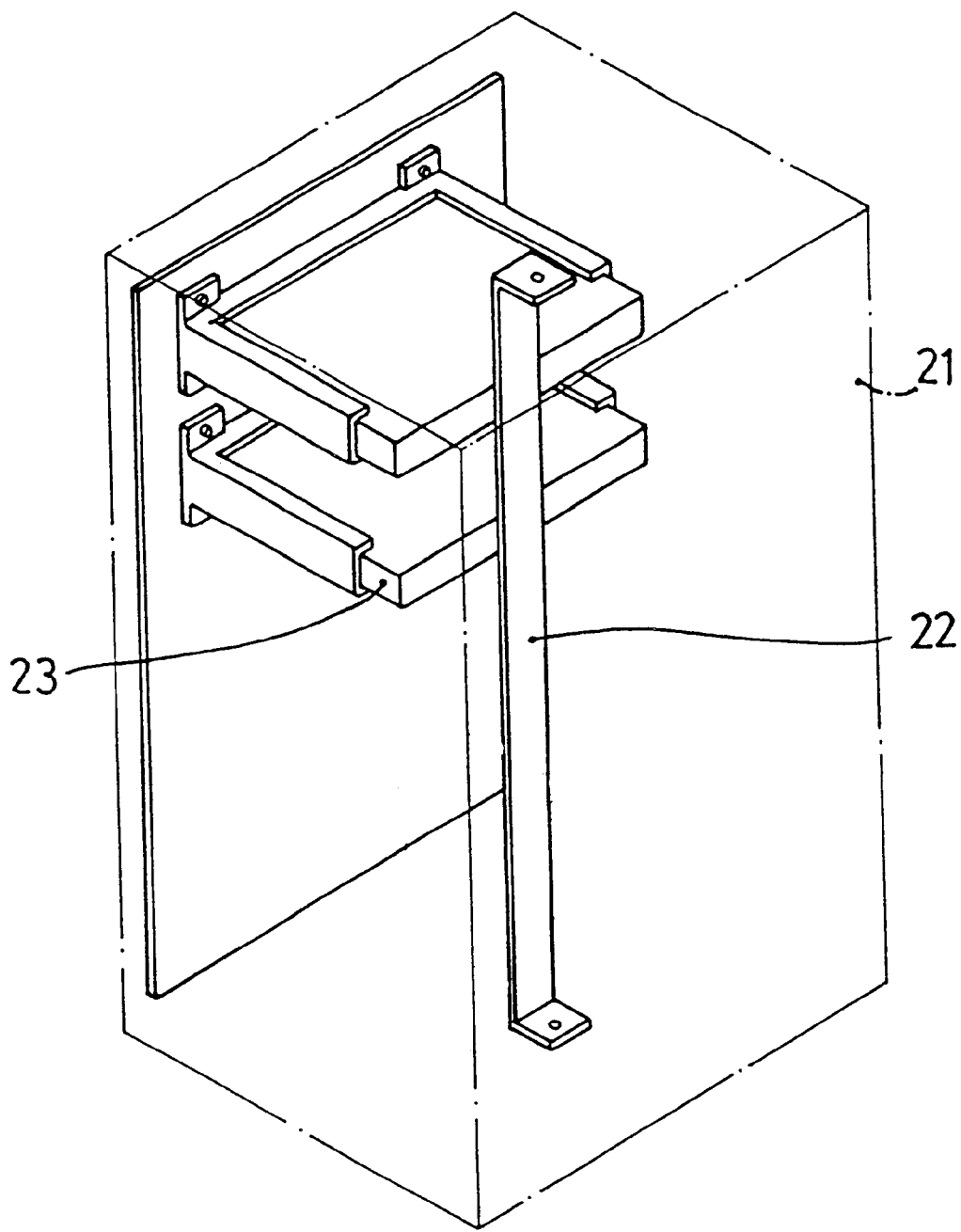
FIG. 2 illustrates one conventional approach to affix the cartridge-type CPUs.
Figure 3:
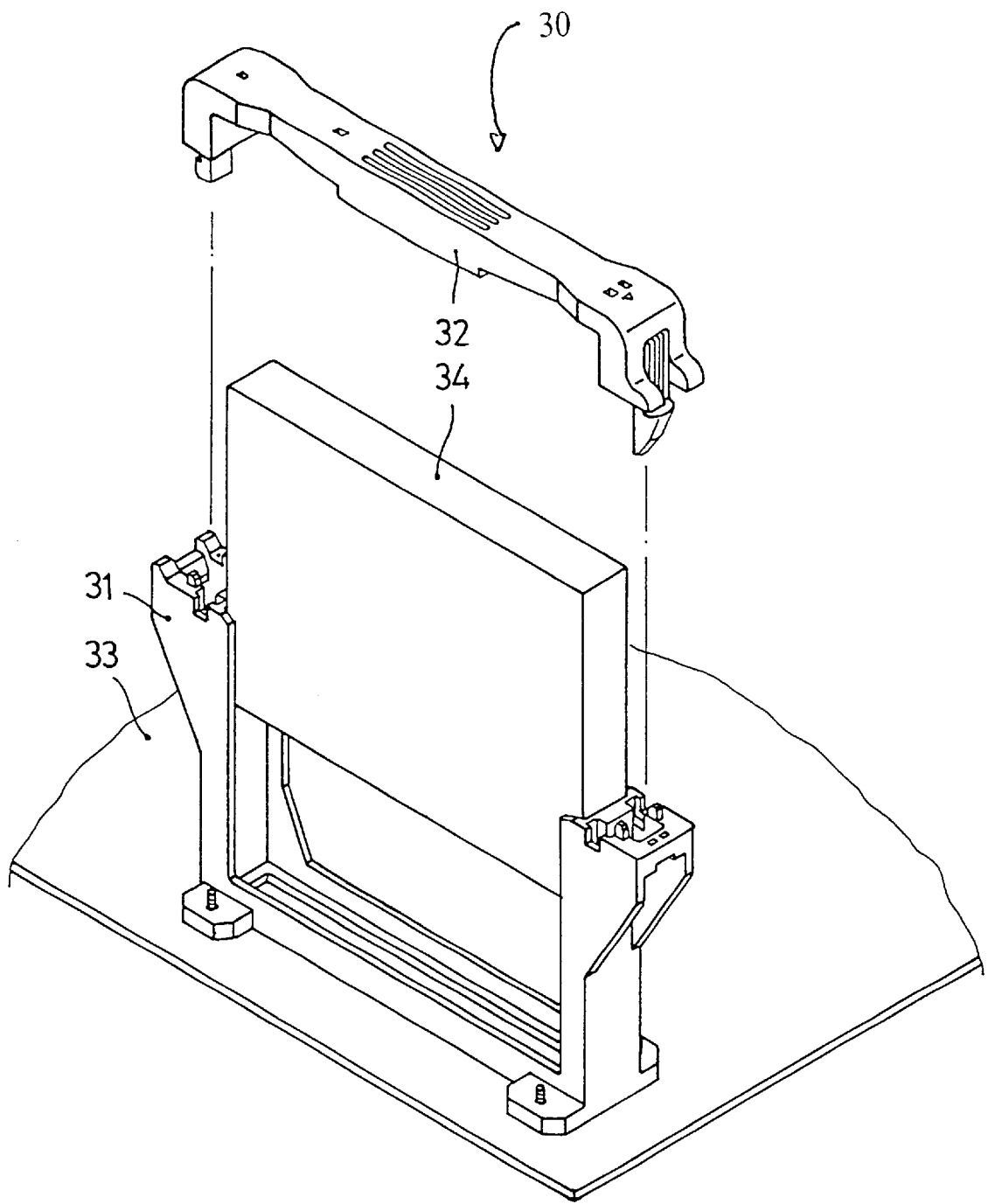
FIG. 3 illustrates a first embodiment of the invention.
Figure 5:
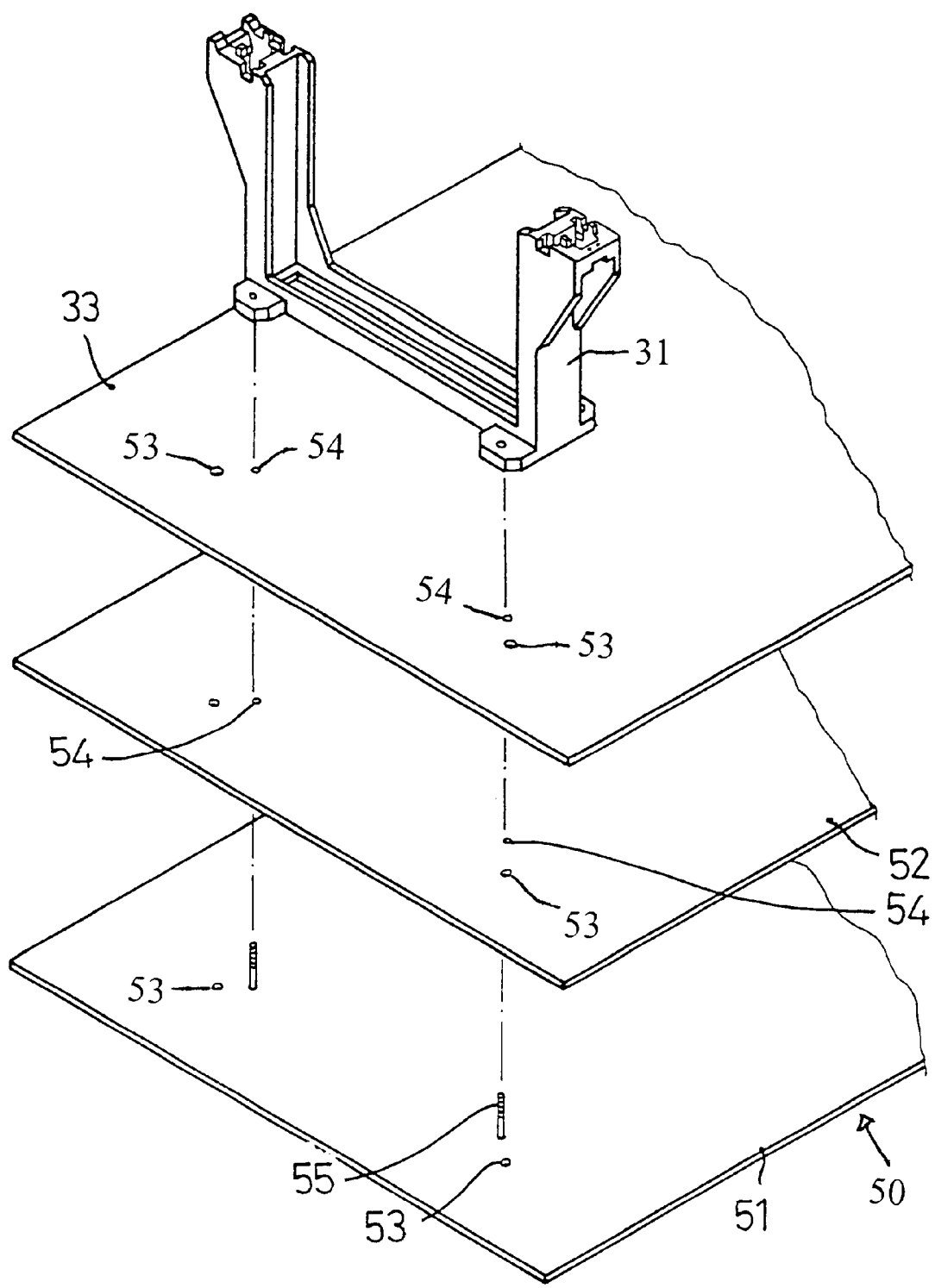
FIG. 5 illustrates the second device of the invention.

As shown in FIG. 3, FIG. 5, FIG. 6(*a*) and FIG. 6(*b*), the attachment system of invention includes a first device 30, a second device 50 and a third device 60. The first device 30, which mainly provides a space for receiving the cartridge-type CPU 34, includes an insertion frame 31 and a retainer 32. The second device 50, which mainly acts as a reinforced board carrying weight of the cartridge-type CPU 34, includes a metal support board 51 and a soft silicon isolation pad 52. The third device 60, which mainly functions to attach the first device 30 and the motherboard 33 to the second device 50, includes a Π-shaped metal frame 61 and a soft cushion 62. Through the third device 60, the weight of the cartridge-type CPU 34 is transferred to the second device 50. The details of each elements mentioned will be introduced hereinafter.

As shown in the explosive view of a first device 30 depicted in FIG. 3, the first device 30 includes an insertion frame 31 and a retainer 32. The retainer 32 is attachable to and detachable from the insertion frame 31. As afore-recited, the first device 30 mainly provides a space for receiving the cartridge-type CPU 34. The insertion frame 31 is attached to a motherboard 33 and provides a slot in which the cartridge-type CPU 34 is removably inserted. In a preferred embodiment, each end of the insert frame 31 is in form of a strut structure. After the cartridge-type CPU 34 is inserted into the insertion frame 31, two ends of the retainer 32 are then inserted into the corresponding respective slot of the insertion frame 31 with a central portion of the retainer 32 pressing toward the corresponding edge of the cartridge-type CPU 34. In this way, the cartridge-type CPU 34 is entirely surrounded by the retainer 32. Although not shown in the figure, it is well known the insertion frame 31 provides electrical signal paths between the cartridge-type CPU 34 and the electrical circuit on the motherboard 33.

Figure 4A:
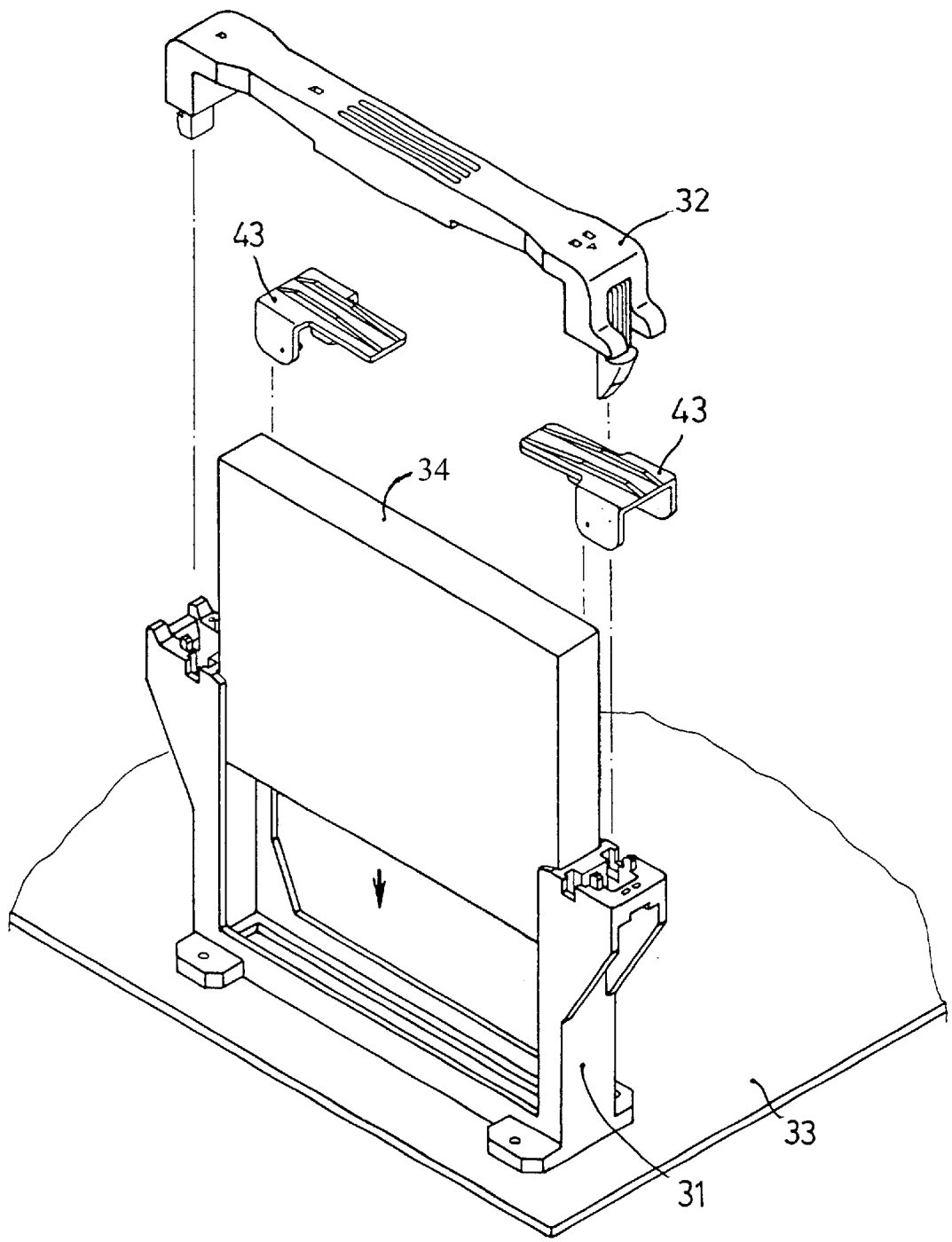
FIG. 4(*a*) illustrates second embodiment of the invention.

Refer to FIG. 4(a), to allow the cartridge-type CPU 34 be conveniently inserted into or detached from the slot of insertion frame 31, the second embodiment for the first device 30 includes an insertion frame 31, a detachable retainer 32, and an uprooting device 43. The functions of the insertion frame 31 and the retainer 32 are as described regarding FIG.3. A tenon-mortise mechanism is provided between the uprooting device 43 and two upper corner ends of the cartridge-type CPU 34 to engage the uprooting device 43 respectively with two upper corner ends of the cartridge-type CPU 34.

Figure 4B:
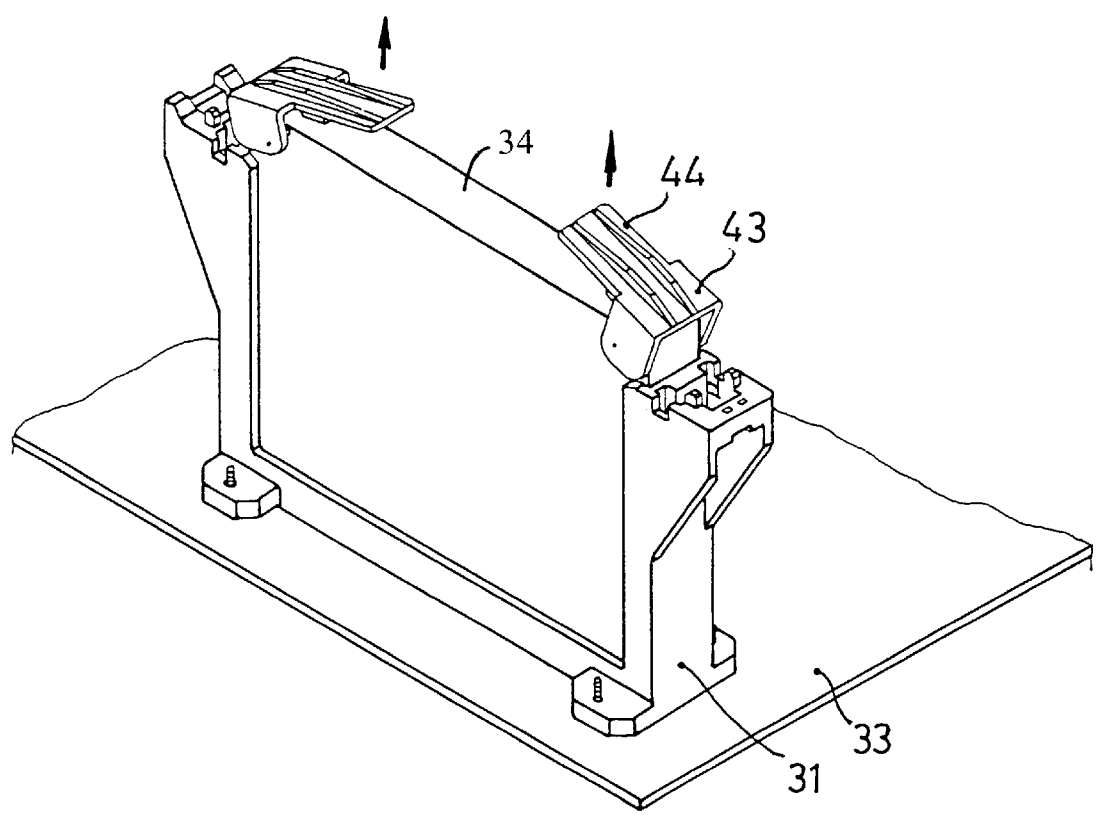

As illustrated in FIG. 4(b), the uprooting device 43 includes a handle 44 at one end which may be pulled up by a fingertip of an operator. As the cartridge-type CPU 34 is within the insertion frame 31 with the uprooting device 43 connected at the upper corner ends of the CPU 34, one may easily pull up the cartridge-type CPU 34 from dead-end location of slot of the insertion frame 31 by applying lifting force, indicated as arrow mark in FIG. 4(b), at the handle 44. The rotation action of handle 44 causes other end of the uprooting device 43 move downwards and pushes against the corresponding edge of the insertion frame 31. This action results in an upwards force, which forces the cartridge-type CPU 34 move upwards and detach itself from the dead-end location of slot of the insertion frame 31.

To avoid having the motherboard 33 carry entire weight of the cartridge-type CPU 34, the second device 50 provided by the invention functions to carry most of the weight of the cartridge-type CPU 34 and fortify the strength of the motherboard 33. Refer to FIG. 5, the second device 50 includes a metal support board 51 and a soft silicon isolation pad 52. The metal support board 51 has multiple holes 53 which correspond to connection counterparts (not shown) on the casing. The holes 53 allow the metal support board 51 along with the motherboard 33 be attached to the computer casing (not shown). The soft silicon isolation pad 52 functions as the buffer layer between the motherboard 33 and the metal support board 51. The soft silicon isolation pad 52 has multiple holes 54, allowing the insertion frame 31, the soft silicon isolation pad 52 together with the motherboard 33 be attached to the metal support board 51. The metal support board 51 has multiple screws 55 which function to pass through the corresponding holes 54 of the soft silicon isolation pad 52 and the motherboard 33, and connect to the insertion frame 31. In a different embodiment, instead of two elements structure recited above, the second device 50 is an integral hard and non-conducting support board.

Figure 6A:
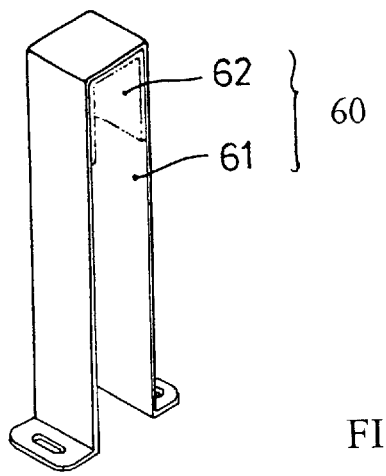
FIG. 6(*a*) illustrates the structure of the third device of the invention, which is used to attach the cartridge-type CPU.
Figure 6B:
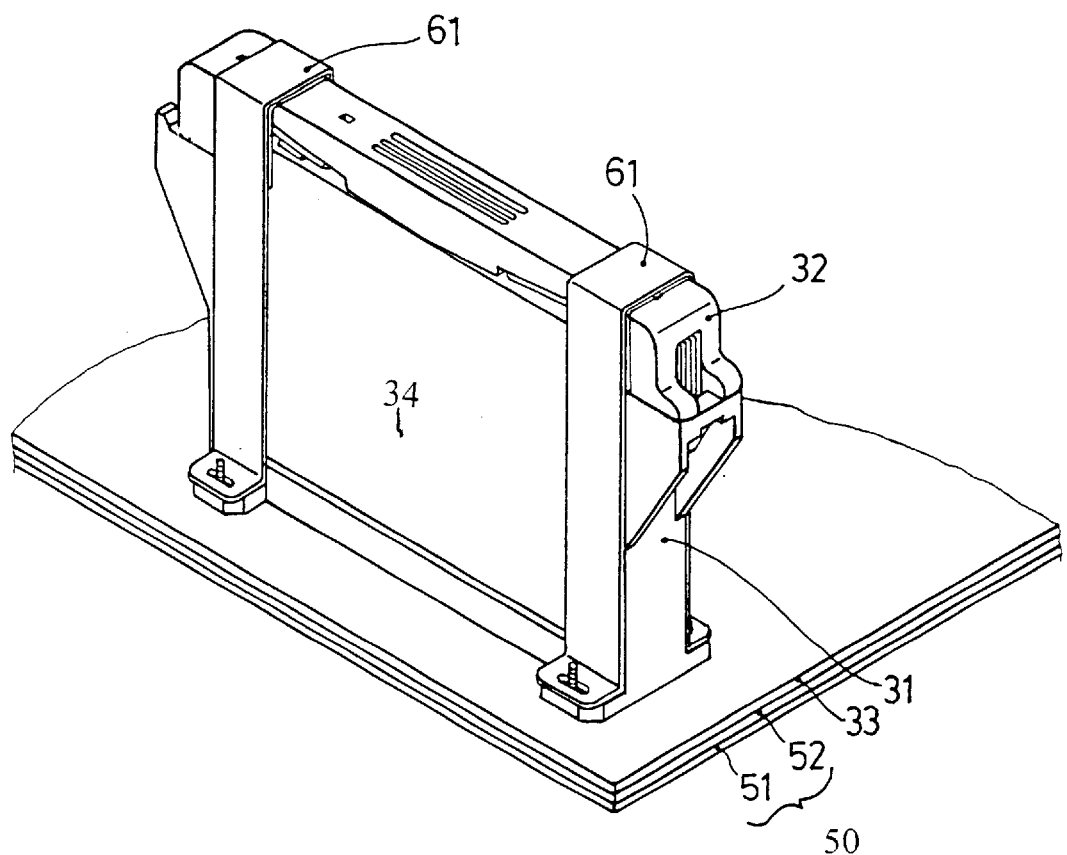

As shown in FIG. 6(a) and FIG. 6(b), the third device 60 functions to attach the first device 30, the inserted cartridge-type CPU 34 and the motherboard 33 to the second device 50. The third device 60 includes a Π-shaped metal frame 61. The inner space defined by the Π-shaped metal frame 61 functions to house the strut structure of first device 30. Each of two end sides of Π-shaped metal frame 61 has a hole allowing passage of the screw 55. Through this arrangement the third device 60 is passed over the first device 30 and the cartridge-type CPU 34 is affixed to the second device 50. This allows the weight of the cartridge-type CPU 34 placed within the first device 30 be transferred to second device 50 via the first device 30 and the third device 60. In this way, the motherboard 33 will not experience damage coming from the loading of the cartridge-type CPU 34. A soft cushion 62 is provided at the inside corners of the Π-shaped metal frame 61 functioning to provide more tight contact between the Π-shaped metal frame 61 and the upper surface of the retainer 32.

The assembly operation of the cartridge-type CPU is performed in the following steps:

1) Place the motherboard 33 on top of the second device 50 with the screws 55 passing through the corresponding holes 54 respectively on the soft silicon isolation pad 52 and the motherboard 33;
2) Attach the insertion frame 31 of the first device 30 to the motherboard 33 and the second device 50 using the screws 55;
3) Install the uprooting device 43 on the two corner ends of the cartridge-type CPU 34;
4) Press the cartridge-type CPU 34 into the slot of insertion frame 31;
5) Attach the retainer 32 onto the insertion frame 31 such that the central portion of the retainer 32 pressing toward the corresponding edge of the cartridge-type CPU 34;
6) Wrap the first device 30 at the location of strut structure thereof using the third device 60 with the corresponding hole aligned to the screw 55, and fasten the third device 60 along with the motherboard 33 to the second device 50 using the screw 55 and the corresponding bolts (not shown).

FIG. 6(b) depicts the invention in assembly form.

Figure 9:
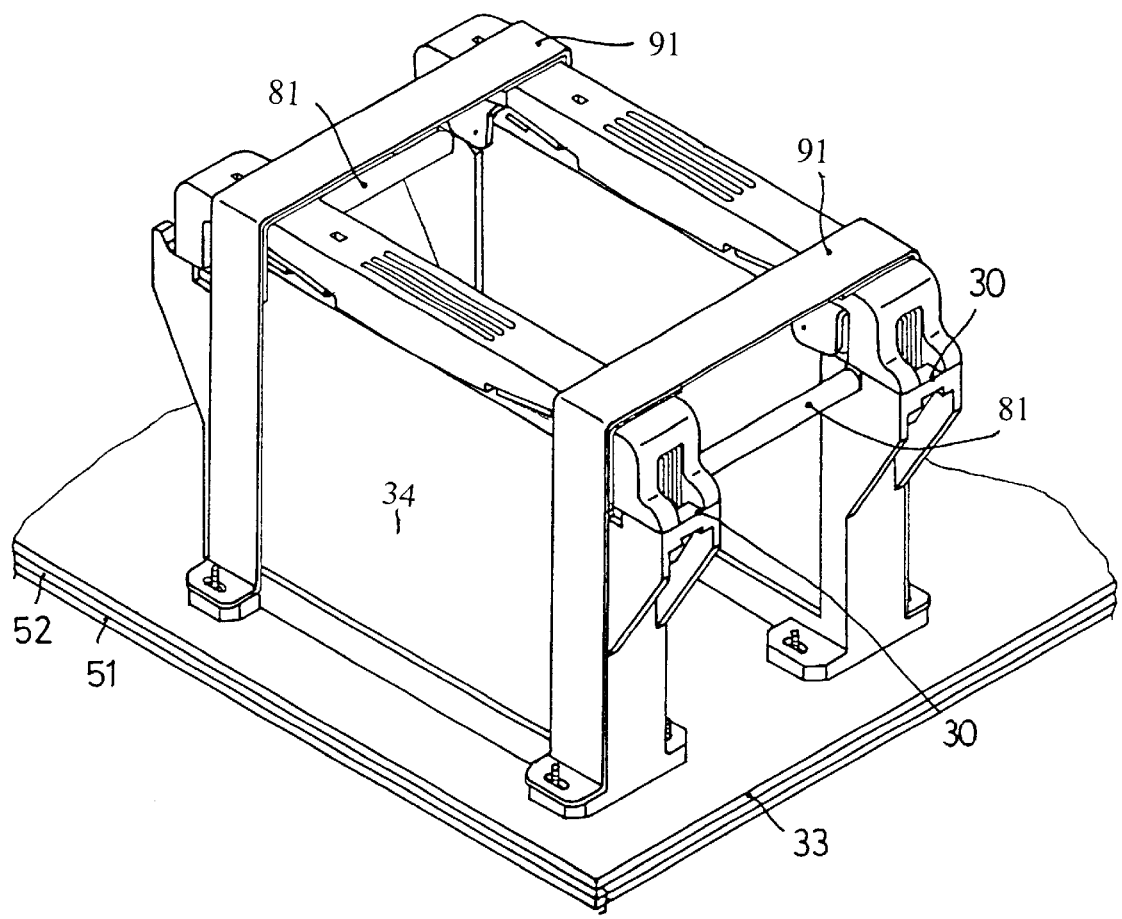
FIG. 9 illustrates multi-processors attached to a motherboard using the invention.

It is known that a more advanced computer system, i.e. server system, usually provides two or more cartridge-type CPUs within the computer system. The present invention also applicable to such multi-processors computer system. FIG. 9 illustrates how the second embodiment of invention is applied to two cartridge-type CPUs provided on the motherboard 33. This arrangement also may attach multiple cartridge-type CPUs without the motherboard taking too much weight from the cartridge-type CPUs 34.

Figure 7A:
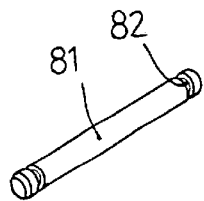
FIG. 7(*a*) illustrates the fourth device of the invention.

As shown in FIG. 7(a), FIG. 7(b) and FIG. 8 and FIG. 9, for motherboard accommodating two cartridge-type CPUs, the second embodiment of the invention includes two first devices 30, a second device 50, two third devices 91 and two fourth devices (hereinafter also referred to as fourth means) 81. The first device 30 includes the insertion frame 31 and a retainer 32. Since the structure and function of the first device 30 shown in FIG. 7 is substantially same as that shown in FIG. 3, similar recitations regarding the first device 30 will not be repeated here for brevity purpose. It is noted that, as shown in FIG. 7(a), the preferred embodiment for the fourth device 81 is in form of a rod. The rod has a circumferential groove 82 provided on each end of the rod. The circumferential groove 82 corresponds to the edge 83 provided on the top edge portion of the insertion frame 31. The arrangement allows the connection of the rod to two adjacent insertion frame 31 with the grooves 82 respectively engaging with the edge 83 illustrated in FIG. 7(b). After the fourth device 81 is installed and the cartridge-type CPUs 34 are inserted into the insertion frames 31, the retainer 32 then is affixed to the insertion frame 31 to complete the assembly process.

The second device 50 mainly includes a metal support board 51 and a soft silicon isolation pad 52. Since the structure and function of the second device 50 shown in FIG. 9 is substantially same as that shown in FIG. 5, recitation regarding the second device 50 will not be repeated here for brevity purpose.

Figure 8:
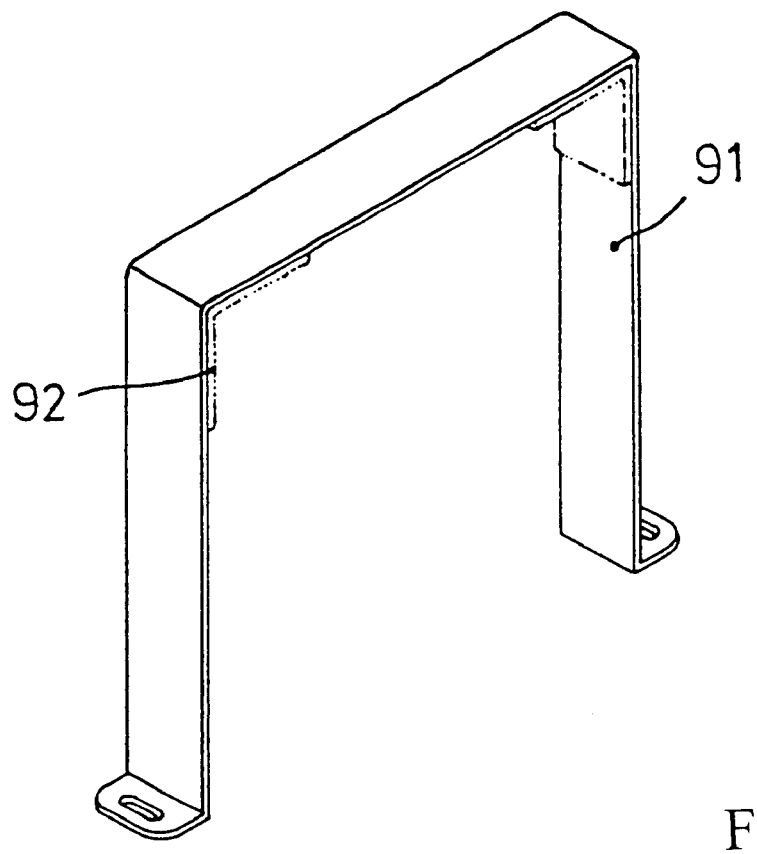
FIG. 8 depicts the second embodiment of the third device of the invention, which is used to attach multiple cartridge-type CPUs.

Similar to the third device 60 in FIG. 6(a) and FIG. 6(b), the third device 91 shown in FIG. 8 and FIG. 9 functions to attach the first device 30 and the motherboard 33 to the second device 50. The third device 91 includes a Π-shaped metal frame. The inner space defined by the Π-shaped metal frame functions to house the strut structure of first device 30. Each of two end sides of Π-shaped metal frame has a hole allowing passage of a screw. Through this arrangement and a bolt (not shown), as the first device 30 and the cartridge-type CPU are enveloped by the third device 91, the third device 91 is affixed to the second device 50. This allows the weight of the cartridge-type CPU 34 placed within the slot of first device 30 be transferred to second device 50 via the first device 30 and the third device 91. In this way, the motherboard 33 will not experience damage coming from the loading of the cartridge-type CPU 34. A soft cushion 92 is provided at the inside corner of the Π-shaped metal frame which functions to provide more tight contact between the Π-shaped metal frame and the upper surface of the retainer 32.

Figure 7B:
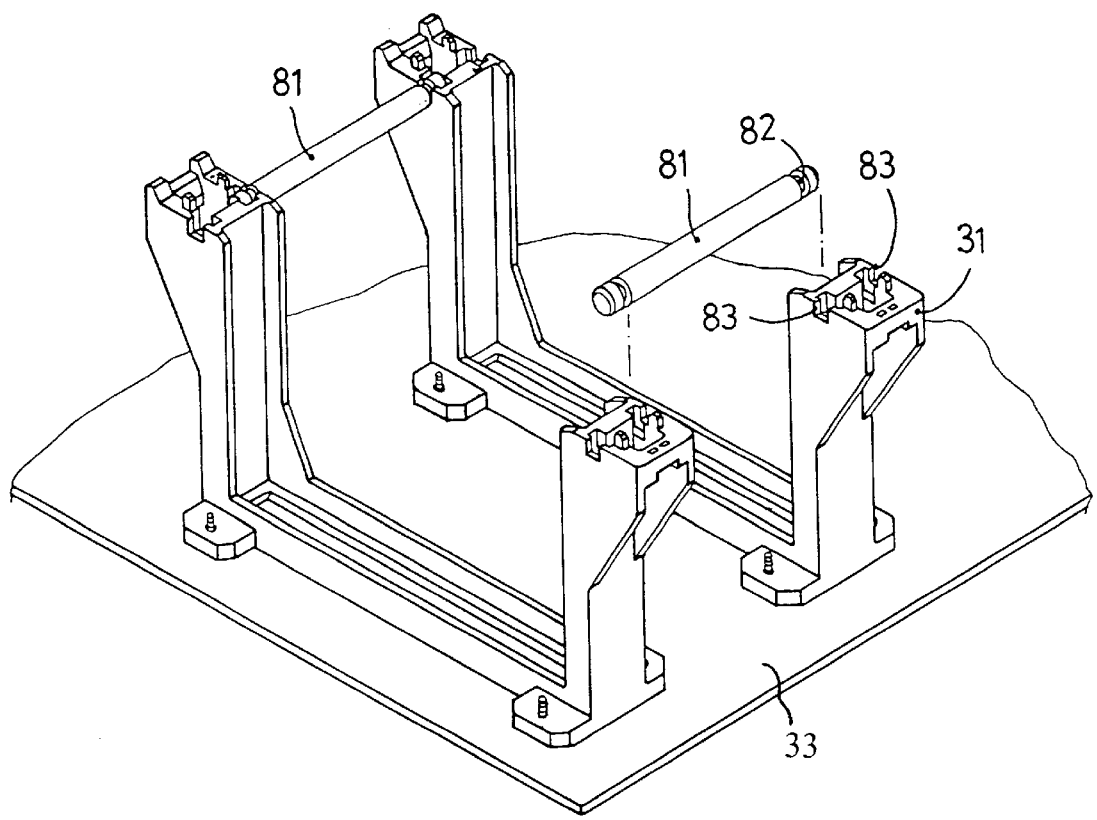

As recited, the arrangement of the fourth device 81 allows the connection of the fourth device 81 to two adjacent insertion frame 31 with two grooves 82 respectively engaging with the edge of cavities as illustrated in FIG. 7(b). Moreover, the fourth device 81 is also used to maintain the distance between two adjacent first device 30. When the motherboard is placed vertically, the weight of the cartridge-type CPU can be transferred to the second device 50 via the third device 91.

Figure 10A:
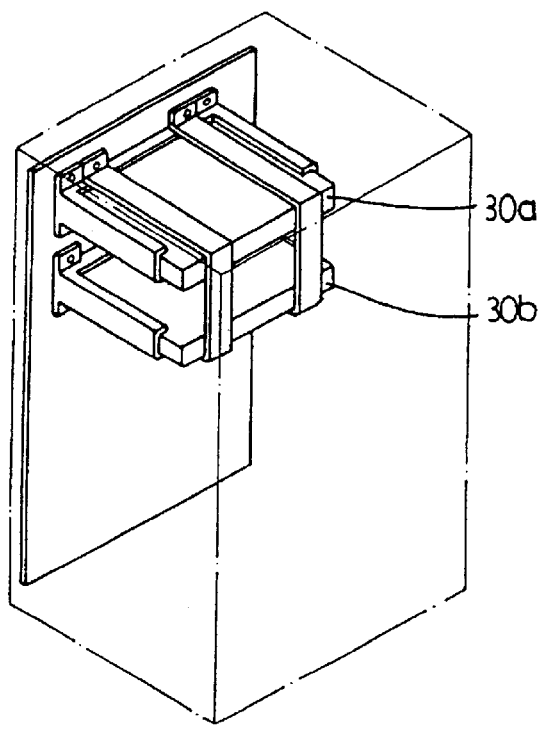
FIG. 10(*a*) illustrates the invention without the fourth device in FIG. 7(*a*) as the motherboard is placed vertically.
Figure 10B:
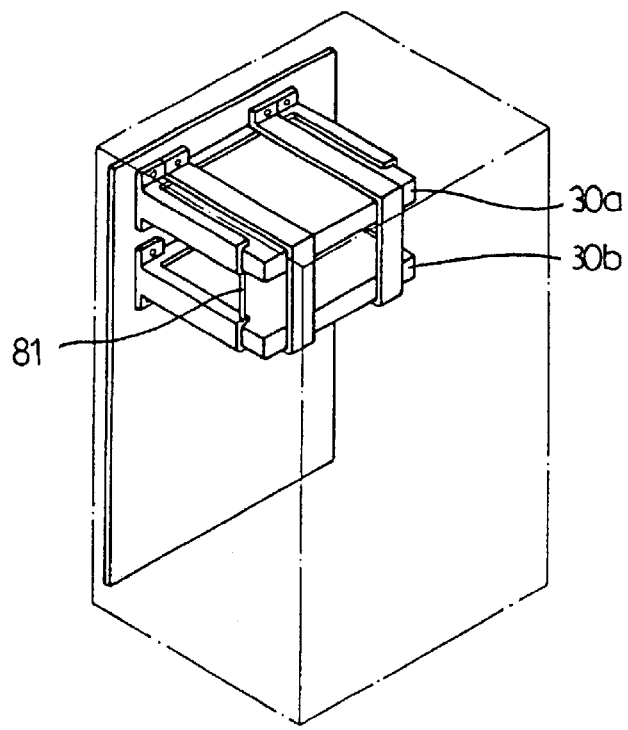

FIG. 10(a) shows the present invention without the provision of the fourth device 81 while FIG. 10(b) shows the present invention with the provision of the fourth device 81. Under condition of FIG. 10(a), it is still possible the motherboard experiences damage. Under condition of FIG. 10(b), the weight of the upper cartridge-type CPU can be supported by the fourth device 81 and transferred to the second device 50 via the fourth device 81. The possibility for the motherboard to break is much lower than that shown in FIG. 10(a).

The assembly operation of the multiple cartridge-type CPUs is performed in the following steps:

(1) Place the motherboard 33 on the top of the second device 50 with the screws 55 passing through the corresponding holes respectively on the soft silicon isolation pad 52 and the motherboard;

(2) Attach the insertion frame 31 of the first device 30 to the motherboard 33 and the second device 50 using the screws 55;

(3) Install the uprooting device 43 on the two corner ends of the cartridge-type CPU 34;

(4) Press the cartridge-type CPUs 34 into the slot of insertion frame 31;

(5) Engage each fourth device with two adjacent insertion frames 31;

(6) Attach the retainer 32 onto the insertion frame 31 such that the central portion of the retainer 32 pressing toward the corresponding edge of the cartridge-type CPU 34;

(7) Wrap the first device 30 at the location of strut structure thereof using the third device 91 with the corresponding hole aligned to the screw 55, and fasten the third device 91 along with the motherboard 33 to the second device 50 using the screw 55 and the corresponding bolts (not shown).

What is claimed is:

1. A system for attaching a cartridge-type central processor unit (CPU) to a motherboard, the system comprising:
   first means having a slot for receiving the cartridge-type CPU;
   second means disposed below the motherboard for fortifying strength of the motherboard;
   third means for attaching said first means and said motherboard to the second means;
   wherein weight of the cartridge-type CPU, via the first means and the third means, is substantially transferred to the second means with the second means being a primary carrier of weight of the cartridge-type CPU.

2. The system of claim 1, wherein the said first means comprises an insertion frame and a retainer, said insertion frame providing the slot and the retainer being operable to attach the cartridge-type CPU into the slot.

3. The system of claim 1, wherein said first means comprises:
   an insertion frame, said insertion frame providing the slot;
   a set of uprooting devices for uprooting said cartridge-type CPU from said slot, each uprooting device attaching to two sides of the cartridge-type CPU via a tenon-mortise type connection;
   a removable retainer for attaching the cartridge-type CPU into the insertion frame.

4. The system of claim 3, wherein said uprooting device comprises a handle, as one end of said handle is lifted, an other end of the handle moves downwards and pushes against said insertion frame resulting in an upward movement of the cartridge-type CPU.

5. The system of claim 1, wherein said second means comprises a hard and nonconducting support board, said support board has hole allowing attachment of said support board to a computer casing.

6. The system of claim 1, wherein said second means comprises:
   a metal support board;
   a soft isolation pad, disposed between said metal support board and the motherboard, for electrically isolating said motherboard;
   said metal support board having holes allowing attachment of said metal support board and the motherboard to a computer casing.

7. The system of claim 6, wherein said soft isolation pad is a silicon isolation pad.

8. The system of claim 1, wherein said third means comprises an attaching frame with two bottom ends, each bottom end having a hole allowing attachment of the first means and the motherboard to said second means.

9. The system of claim 8, wherein said attaching frame is a Π-shaped metal frame provided with a cushion for tightly contacting against said first means.

10. A method for attaching a cartridge-type CPU to a motherboard of a computer system, said system comprising a first means, a second means and a third means, the first means having a slot for receiving the cartridge-type CPU, the second means being disposed below the motherboard for fortifying strength of the motherboard, third means attaching said first means and said motherboard to the second means, said method comprising the steps of:

(1) inserting the cartridge-type CPU into the slot of said first means;

(2) disposing said second means below the motherboard;

(3) attaching said first means and motherboard to said second means via said third means, such that weight of the cartridge-type CPU is substantially transferred to the second means with the second means being a primary carrier of weight of the cartridge-type CPU.

11. A system for attaching M cartridge-type central processor units (CPUs) to a vertically-disposed motherboard, M is a positive integer, said system comprising:

M first means, each first means being spaced to one adjacent first means by a predetermined space, and each first means having a slot for receiving one corresponding cartridge-type CPU;

second means disposed below the motherboard for fortifying strength of the motherboard;

third means for attaching each first means and said motherboard to the second means;

fourth means for transferring combined weight of each first means and said one corresponding cartridge-type CPU to said one adjacent first means.

12. The system of claim 11, wherein the said first means comprises an insertion frame and a retainer, said insertion frame providing the slot and the retainer being operable to attach the cartridge-type CPU into the slot.

13. The system of claim 11, wherein said first means comprises an insertion frame, said insertion frame providing the slot;

a set of uprooting devices for uprooting said cartridge-type CPU from said slot, each uprooting device attaching to two sides of the cartridge-type CPU via a tenon-mortise type connection;

a removable retainer for attaching the cartridge-type CPU into the insertion frame.

14. The system of claim 13, wherein said uprooting device comprises a handle, as one end of said handle is lifted, an other end of the handle moves downwards and pushes against said insertion frame resulting in an upward movement of the cartridge-type CPU.

15. The system of claim 11, wherein said second means comprises a hard and nonconducting support board, said support board has hole allowing attachment of said support board to a computer casing.

16. The system of claim 11, wherein said second means comprises a metal support board;

a soft isolation pad, disposed between said metal support board and the motherboard, for electrically isolating said motherboard;

said metal support board having holes allowing attachment of said metal support board and the motherboard to a computer casing.

17. The system of claim 16, wherein said soft isolation pad is a silicon isolation pad.

18. The system of claim 11, wherein said third means comprises an attaching frame with two bottom ends, each bottom end having a hole allowing attachment of the first means and the motherboard to said second means.

19. The system of claim 18, wherein said attaching frame is a Π-shaped metal frame provided with a cushion for tightly contacting against said first means.

20. The system of claim 11, wherein said fourth means comprises at least one rod respectively attached to the two adjacent first means for transferring combined weight of each first means and said one corresponding cartridge-type CPU to said one adjacent first means.

* * * * *